(12) United States Patent
Kanaya et al.

(10) Patent No.: US 7,615,116 B2
(45) Date of Patent: Nov. 10, 2009

(54) METHOD FOR PRODUCING SILICON EPITAXIAL WAFER AND SILICON EPITAXIAL WAFER

(75) Inventors: Koichi Kanaya, Nishishirakawa-gun (JP); Tsuyoshi Nishizawa, Nishishirakawa-gun (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 392 days.

(21) Appl. No.: 10/572,465

(22) PCT Filed: Sep. 27, 2004

(86) PCT No.: PCT/JP2004/014080

§ 371 (c)(1),
(2), (4) Date: Mar. 20, 2006

(87) PCT Pub. No.: WO2005/034219

PCT Pub. Date: Apr. 14, 2005

(65) Prior Publication Data

US 2007/0119367 A1    May 31, 2007

(30) Foreign Application Priority Data

Oct. 1, 2003  (JP) .............................. 2003-342943

(51) Int. Cl.
*C30B 21/02* (2006.01)
(52) U.S. Cl. ............................ 117/84; 117/90; 117/93; 117/94; 117/939

(58) Field of Classification Search ................ 117/84, 117/90, 93, 94, 105, 939
See application file for complete search history.

(56) References Cited

U.S. PATENT DOCUMENTS

| | | | |
|---|---|---|---|
| 6,444,027 B1 | 9/2002 | Yang et al. | |
| 6,596,086 B1 * | 7/2003 | Honma et al. | ............... 118/728 |
| 2001/0037761 A1 | 11/2001 | Ries et al. | |
| 2001/0039917 A1 | 11/2001 | Arai et al. | |
| 2001/0041258 A1 | 11/2001 | Passek et al. | |
| 2001/0054390 A1 | 12/2001 | Halpin et al. | |
| 2003/0041799 A1 * | 3/2003 | Yang et al. | .................. 117/200 |
| 2004/0241992 A1 * | 12/2004 | Kono et al. | ................. 438/689 |

FOREIGN PATENT DOCUMENTS

| | | |
|---|---|---|
| EP | 1 569 264 A1 | 8/2005 |
| JP | A 06-318630 | 11/1994 |
| JP | A 2000-26192 | 1/2000 |
| JP | A-2000-103696 | 4/2000 |
| JP | A 2002-39921 | 2/2002 |
| JP | A-2002-141294 | 5/2002 |
| JP | A 2003-532612 | 11/2003 |
| WO | WO 99/23690 A1 | 5/1999 |
| WO | WO 01/86035 A1 | 11/2001 |
| WO | WO 03/060967 A1 | 7/2003 |

* cited by examiner

Primary Examiner—Robert M Kunemund
(74) Attorney, Agent, or Firm—Oliff & Berridge, PLC (57) ABSTRACT

In a vapor phase growth apparatus including a reaction chamber, a susceptor, a lift pin, an upper heating device, and a lower heating device, a heating ratio between the upper heating ratio and the lower heating ratio is adjusted.

1 Claim, 6 Drawing Sheets

METHOD FOR PRODUCING SILICON EPITAXIAL WAFER AND SILICON EPITAXIAL WAFER

TECHNICAL FIELD

The present invention relates to a method for producing a silicon epitaxial wafer, for performing a vapor phase growth of a silicon epitaxial layer on a main surface of a silicon wafer on a susceptor using a vapor phase growth apparatus, and to a silicon epitaxial wafer.

BACKGROUND ART

A known vapor phase growth apparatus for performing a vapor phase growth of a silicon epitaxial layer on a main surface of a silicon wafer, has the following structure: a silicon wafer is conveyed into a reaction chamber and mounted on a susceptor within the reaction chamber, and, in that state, the silicon wafer is heated by an upper lamp provided on the upper side of the susceptor and a lower lamp provided in the lower side of the susceptor. Simultaneously, raw material gas is fed onto the main surface of the silicon wafer to cause the vapor phase growth, and after the vapor phase growth, a silicon epitaxial wafer obtained by the vapor phase growth is moved out of the reaction chamber.

Here, there are various methods of mounting a silicon wafer on a susceptor or removing the same from the susceptor. As one of these methods, the following method is known: at least three lift pins that can be ejected upward from the upper surface of a susceptor are ejected to approximately the same extent as each other, and a silicon wafer is carried onto the ejected lift pins to be supported by the lift pins approximately horizontally. Thereafter, by descending the lift pins simultaneously, the silicon wafer is mounted on the susceptor. After the vapor phase growth, the mounted silicon epitaxial wafer is ascended by ejecting movements of the lift pins and then carried out of a reaction chamber by a conveying device (hereinafter, this method is referred to as a "lift pin method"). (For example, see Patent Document 1.)

In the susceptor of the lift pin method, holes for inserting the lift pins through them (hereinafter, referred to as "lift pin insertion holes") are formed so that they are passing through both sides of the susceptor, and the lift pins are inserted through the lift pin insertion holes.

In order to perform the vapor phase growth of a silicon epitaxial layer on a main surface of a silicon wafer using such a vapor phase growth apparatus, first of all, a silicon wafer is conveyed into a reaction chamber and mounted on a susceptor, and thereafter, a hydrogen treatment is performed by heating the inside of the reaction chamber up to hydrogen heat treatment temperature. Thus, a natural oxide on the surface of the silicon wafer is etched and removed by hydrogen.

Next, the inside of the reaction chamber is set at a growth temperature, and silicon raw material gas is fed onto the main surface of the silicon wafer. Thus, the vapor phase growth of a silicon epitaxial layer is performed on the main surface of the silicon wafer, and a silicon epitaxial wafer is thus produced.

Moreover, there is known a susceptor having a plurality of through holes at positions where a silicon wafer is mounted, in order to remove a natural oxide on the rear surface of a silicon wafer during vapor phase growth (for example, see Patent Document 2).

Patent Document 1: Japanese Patent Laid-Open Publication No. Tokukai-Hei 6-318630

Patent Document 2: United States Patent No. 6444027

DISCLOSURE OF THE INVENTION

Problem to be Solved by the Invention

Incidentally, when producing a silicon epitaxial wafer by performing vapor phase growth using the lift pin method described above, typically, heat tends to be released below a susceptor through lift pins, and therefore, the thickness of a silicon epitaxial layer obtained by the vapor phase growth on the main surface of a silicon single crystal substrate ends up being smaller near the lift pins than the rest of the areas, and the surface shape of the silicon epitaxial layer becomes partially recessed.

Meanwhile, when vapor phase growth is performed using a susceptor with a plurality of through holes for removing a natural oxide on the rear surface of a silicon wafer, after the vapor phase growth process, projected portions may be formed on the rear surface of the silicon epitaxial wafer at positions corresponding to the locations where the through holes are formed. Further, the projected portions are also made at positions corresponding to gaps between the lift pins and the lift pin insertion holes. In this case, however, the projected portions have a ring shape on the outer side of the gap. Therefore, the projected portions are formed on the rear-surface of a silicon epitaxial wafer, affecting the shape thereof.

These uneven portions have different formation patterns on a silicon epitaxial wafer, and different heights or depths depending on vapor phase growth apparatuses with the same lift pin method, and it is thus turned out that the apparatuses cause variations.

The present invention has been accomplished in the light of the above problem, and by removing variations of apparatuses, the shape of uneven portions formed by a vapor phase growth apparatus of the lift pin method on the main surface of a silicon epitaxial layer can be made flatter than a conventional one. An object of the present invention is to provide a method for producing a silicon epitaxial wafer, which can prevent projected portions (at the locations of the lift pin insertion holes, there may be both uneven portions) from being made on the rear surface of a silicon epitaxial wafer at positions corresponding to through holes (including lift pin insertion holes) made in a susceptor.

Means for Solving the Problem

In order to solve the above problem, a method for producing a silicon epitaxial wafer according to an embodiment of the present invention is a method for producing a silicon epitaxial wafer by growing a silicon epitaxial layer by vapor phase growth on a main surface of a silicon wafer placed on a susceptor by using a vapor phase deposition apparatus comprising: a reaction chamber; the susceptor which is placed within the reaction chamber and on which the silicon wafer is mounted; a lift pin which is vertically movable relative to the susceptor and allows a silicon single crystal substrate to be mounted on/removed from the susceptor when the lift pin is vertically moved in a state that the silicon wafer is supported from a lower surface side; an upper heating member for heating the susceptor from an upper side; and a lower heating member for heating the susceptor from an lower side, wherein a heating ratio between the upper heating member and the lower heating member is adjusted so that a surface shape of the silicon epitaxial layer formed near the lift pin on the main surface of the silicon wafer is controlled.

According to the method for producing a silicon epitaxial wafer of the present invention, by adjusting a heating ratios between the upper heating member and the lower heating member in vapor phase growth apparatuses of the same lift pin type to control a growth rate of a silicon epitaxial layer formed near the lift pin, it becomes possible to prevent the silicon epitaxial layer deposited at position on the main surface near the lift pin from becoming thinner than the other areas. Therefore, the silicon epitaxial layers have better flatness near the lift pin, and variations by the apparatuses can be reduced.

Note that it is considered that the variations by the apparatuses occur due to changes and variations of heat characteristics of lamps, accuracy of attached positions of the lamps, as well as shapes, degradation, and contamination of lamp reflectors, or shapes of susceptors, in, for example, apparatuses having a plurality of lamps as generally-used heat source.

Further, a method for producing a silicon epitaxial wafer according to an embodiment of the present invention is a method for producing a silicon epitaxial wafer by growing a silicon epitaxial layer by vapor phase growth on a main surface of a silicon wafer placed on a susceptor by using a vapor phase growth apparatus comprising: a reaction chamber; the susceptor which is placed within the reaction chamber and on which the silicon wafer is mounted; a through hole (including a lift pin insertion hole) formed at a position of the susceptor where the silicon wafer is mounted; an upper heating member for heating the susceptor from an upper side; and a lower heating member for heating the susceptor from a lower side, wherein a heating ratio between the upper heating member and the lower heating member is adjusted so that shapes of uneven portions formed on a rear surface of the silicon wafer are controlled.

During a hydrogen heat treatment performed prior to vapor phase growth, a natural oxide formed on the rear surface of the silicon wafer is etched and removed by hydrogen gas which has entered through the through hole (including a gap in the lift pin insertion hole) formed in the susceptor. Thereafter, when the portion where the natural oxide was removed comes into contact with raw material gas, silicon epitaxial growth of silicon occurs partially. Since silicon raw material gas enters through the through hole (including the lift pin insertion hole) towards the rear surface of the silicon wafer facing the susceptor, a silicon film is partially grown at a position corresponding to the position where the through hole (including the lift pin insertion hole) is formed, and a projected portion (sometimes uneven portions at a position corresponding to the lift pin insertion hole) is formed.

According to the method for producing a silicon epitaxial wafer of the present invention, by adjusting the heating ratio between the upper heating member and the lower heating member, a growth rate of a silicon film on the rear surface can be reduced. Therefore, it becomes possible to suppress generation of uneven portions on the rear surface of the silicon epitaxial wafer.

The invention according to an embodiment of the present invention is a silicon epitaxial wafer, wherein uneven portions formed on a front surface of the silicon epitaxial wafer at a position corresponding to a position at which a silicon wafer is mounted and to a through hole (including a lift pin insertion hole) formed near a lift pin and/or in a susceptor have shapes (height or depth) of not more than 4 nm and/or a projected portion formed on a rear surface has a shape (height) of not more than 10 nm.

As described so far, in the present invention, by reducing the generation of uneven portions on the surface and/or the rear surface of a silicon epitaxial wafer, it becomes possible to obtain a silicon epitaxial wafer having better flatness. In particular, by controlling the shape of the projected portions formed on the rear surface of the silicon epitaxial wafer, the projected shape of the rear surface is not transferred to the top surface in a process of suction-hold of the rear surface of the wafer during a device manufacturing process. Therefore, no problem occurs in terms of, for example, photomicrography.

Effect of the Invention

According to the invention, by adjusting a heating ratio between the upper heating device and the lower heating device, the surface shape of a silicon epitaxial layer formed near the lift pins can be controlled, or the shape of uneven portions formed on the rear surface of the silicon epitaxial wafer can be controlled. Therefore, by performing vapor phase growth on a silicon wafer by making appropriate adjustments of the heating ratio, the shape of the main surface of the silicon epitaxial layer is flattened, and uneven portions are prevented from being generated on the rear surface of a silicon epitaxial wafer at a location corresponding to the through hole (including the lift pin through hole) formed in the susceptor.

BEST MODE FOR CARRYING OUT THE INVENTION

Hereinafter, the embodiment of the present invention is described based on the drawings.

First, a structure of a single wafer type of vapor phase growth apparatus is explained as a preferred example of a vapor phase growth apparatus, which is employed for a method for producing a silicon epitaxial wafer of this embodiment.

Figure 1:
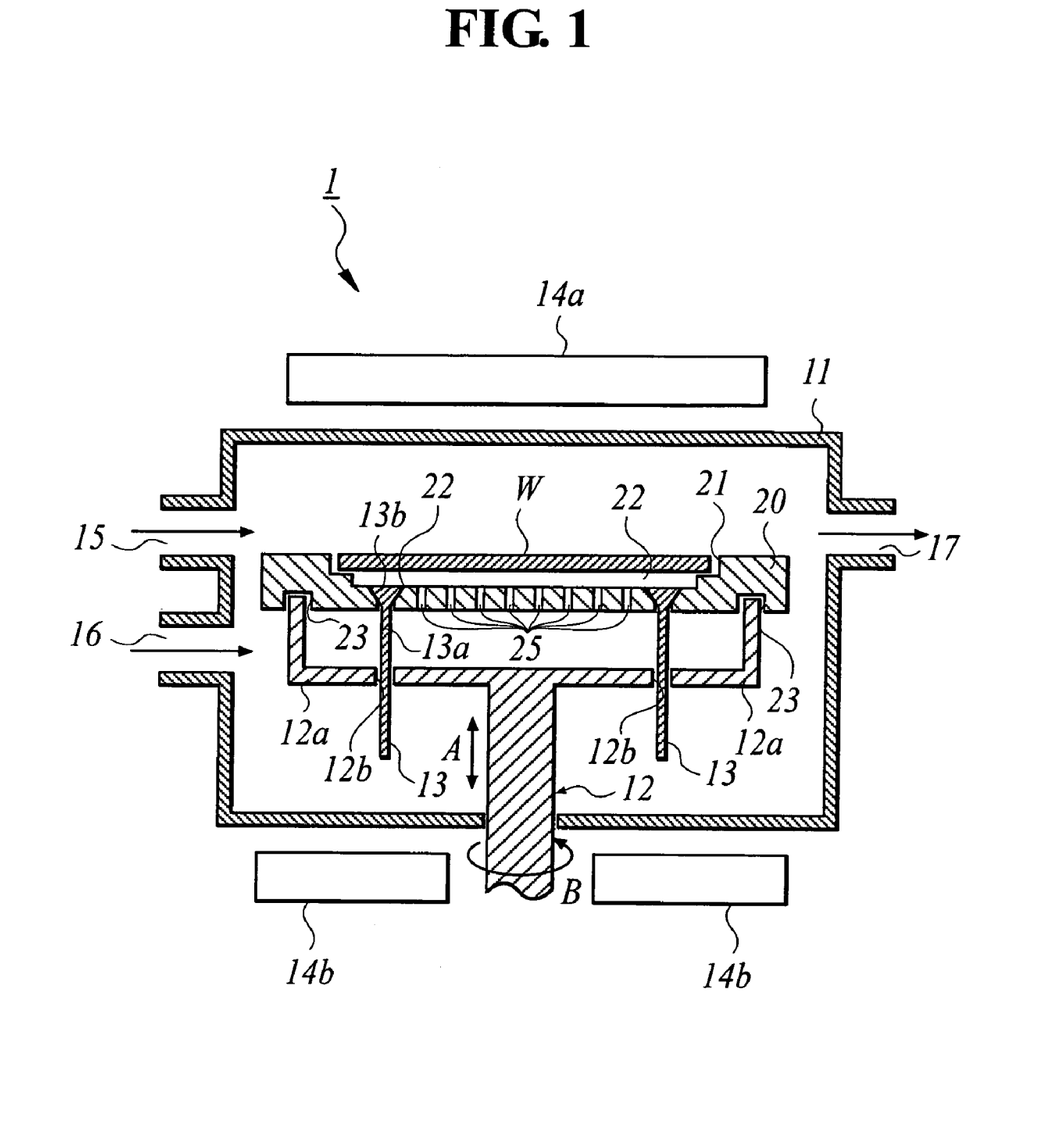
[FIG. 1] This is a view for explaining an embodiment of the present invention and is a schematic front cross-sectional view of a reaction chamber, specifically illustrating a state during vapor phase growth.

As shown in FIG. 1, a vapor phase growth apparatus 1 includes a reaction chamber 11 and a susceptor 20 which is provided within the reaction chamber 11 and supports a silicon wafer W using its upper surface.

The reaction chamber 11 includes a vapor phase growth gas inlet pipe 15 which sends vapor phase growth gas containing raw material gas (for example, trichlorosilane) and carrier gas (for example, hydrogen) into the reaction chamber 11 towards the area above the susceptor 20 and supplies the vapor phase growth gas onto the main surface of the silicon wafer W on the susceptor 20.

Further, the reaction chamber 11 includes a purge gas inlet pipe 16, which sends purge gas (for example, hydrogen) into the reaction chamber 11 towards the lower area of the susceptor 20, on the side where the vapor phase growth gas inlet pipe 15 is provided.

Moreover, the reaction chamber 11 includes a discharge pipe 17, through which gas (vapor phase growth gas and purge gas) within the reaction chamber 11 is discharged, on the opposite side of the vapor phase growth gas inlet pipe 15 and the purge gas inlet pipe 16.

Outside the reaction chamber 11, an upper heating device (upper heating member) 14a for heating the reaction chamber 11 from the upper side, and a lower heating device (lower heating member) 14b for heating the reaction chamber 11 from the lower side are provided. The heating devices 14a and 14b may be, for example, halogen lamps.

Moreover, as described later, a heating ratio between the upper heating device 14a and the lower heating device 14b can be controlled, and, by controlling the heating ratio, a silicon epitaxial wafer according to the present invention can be produced.

The susceptor 20 is constructed by, for example, graphite coated with silicon carbide. The susceptor 20 is formed into, for example, a disc-like shape, and, on its main surface, a pocket 21 which is a recessed portion having an approximate circular shape in plan view, is formed for positioning of the silicon wafer on the main surface.

At the bottom of the pocket 21, lift pin holes 22 through which lift pins 13 for supporting the silicon wafer W mounted on the pocket 21 and moving the silicon wafer W vertically are inserted, are formed.

Each lift pin 13 has a body portion 13a formed into a round bar shape and a head portion 13b for supporting the silicon wafer W, which is formed at the top end of the body portion 13a and supports the silicon wafer W. The head portion 13b has a larger diameter than the body portion 13a so that the head portion 13b can support the silicon wafer W easily.

At the position where the silicon wafer W is mounted in the pocket 21, a plurality of through holes 25 passing through the top to the bottom of the susceptor 20, are formed. During vapor phase growth, hydrogen serving as purge gas enters from the rear side of the susceptor 20 through the through holes 25. Thus, it is possible to etch and remove a natural oxide formed on the rear surface of the silicon wafer W. As shown in FIG. 1, the peripheral edge of the silicon wafer W is supported by the pocket 21 to provide a space between the rear surface of the silicon wafer W and the through holes 25. It is possible to etch a natural oxide more uniformly.

Moreover, on the rear surface of the susceptor 20, a susceptor supporting member 12 is provided to support the susceptor 20 from the rear surface thereof. The susceptor supporting member 12 is movable in a vertical direction shown in the arrow A and also pivotable in the direction shown by the arrow B. At the end of the susceptor supporting member 12, a plurality of radial branches of support arms 12a is provided.

Further, the end of each support arm 12a is fit into a recessed portion 23 formed in the rear surface of the susceptor 20 so that the top surface of the susceptor 20 becomes approximately horizontal. Moreover, each support arm 12a has a hole 12b through which the body portion 13a of the lift pin 13 is inserted.

Next, a method for producing a silicon epitaxial wafer according to the present invention is described. In this method, a silicon epitaxial wafer is produced by vapor phase growth of a silicon epitaxial layer on a silicon wafer W using the vapor phase growth apparatus 1 having the above structure.

First of all, as shown in FIG. 1, a silicon wafer W is supported by the susceptor 20 within the reaction chamber 11 in which temperature is set at initial temperature (for example 650 degrees centigrade).

In order to do this, each lift pin 13 is ascended relatively to the susceptor 20 so that the lift pins 13 are ejected above the top surface of the susceptor 20 to almost the same extent, and the silicon wafer W is moved onto the lift pins 13. Specifically, the susceptor 20 is descended as the susceptor supporting member 12 goes down, and, in the process of the descending, once the bottom ends of the lift pins 13 reach the inner bottom surface of the reaction chamber 11, the lift pins 13 cannot go down any further, but the susceptor 20 continues to descend. Therefore, the lift pins 13 start ascending relative to the susceptor 20, and a state shown in FIG. 2 without the silicon wafer W is realized.

Figure 2:
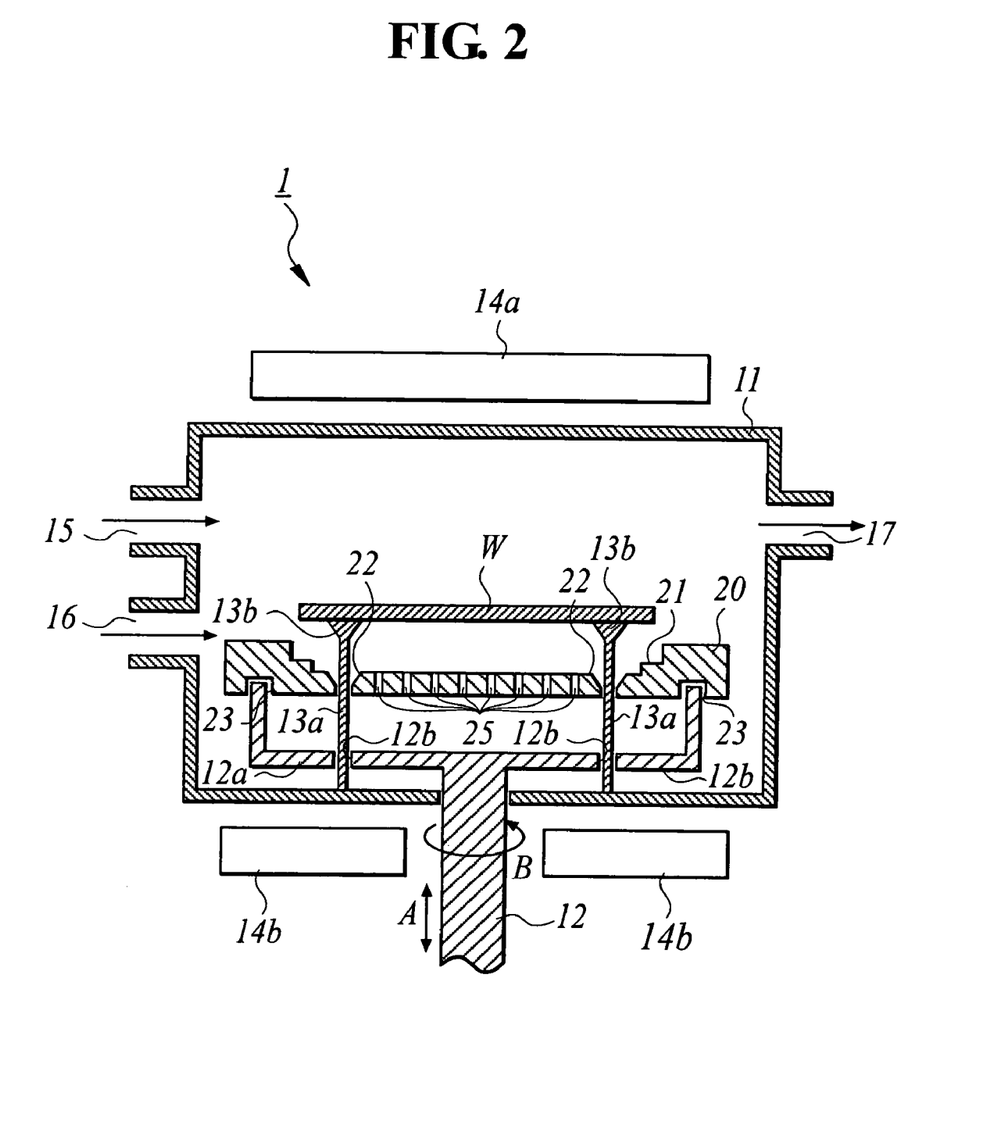
[FIG. 2] This is a view for explaining the embodiment of the present invention, and is a schematic front cross-sectional view of a reaction chamber, specifically illustrating a state where a silicon wafer is supported by lift pins above a susceptor.

In this state where the lift pins 13 are moved up relatively to the susceptor 20, the silicon wafer W is conveyed by a non-illustrated handler into the reaction chamber 11, and the silicon wafer W is then supported by the head portions 13b of the lift pins 13 with its main surface facing up.

Thereafter, while the handler is retracted, the susceptor 20 is ascended as the susceptor supporting member 12 moves up. During this ascending process, once the peripheral portion of the pocket 21 reaches the rear surface of the silicon wafer W, the silicon wafer W which was supported on the head portions 13b of the lift pins 13 by then is now supported by the peripheral portion of the pocket 21.

Further, once the edge portions of the lift pin holes 22 reach the head portions 13a of the lift pins 13, the lift pins 13 which were supported by the inner bottom surface or the like of the reaction chamber 11 by then are now supported by the susceptor 20 (see FIG. 1).

After the silicon wafer W is supported by the susceptor 20 in the above way, a heat treatment (a hydrogen heat treatment process) is carried out on the silicon wafer W within the reaction chamber 11 having a hydrogen atmosphere.

To be more specific, in a state where hydrogen gas is supplied into the reaction chamber 11 through the vapor phase growth gas inlet pipe 15 and the purge gas inlet pipe 16, respectively, the upper heating device 14a and the lower heating device 14b are powered to heat the reaction chamber 11 so that the temperature within the reaction chamber 11 reaches hydrogen heating treatment temperature (for example, 1110 degrees centigrade or higher but not exceeding 1180 degrees centigrade). In this process, the susceptor supporting member 12 is rotated about the vertical axis to rotate the susceptor 20 and the silicon wafer W.

Accordingly, the natural oxide on the main surface of the silicon wafer W is etched and removed by the hydrogen gas. The natural oxide on the rear surface of the silicon wafer W is also etched by the hydrogen gas that has reached the rear surface through the through holes 25. In this occasion, by adjusting the heating ratio between the upper heating device 14a and the lower heating device 14b, the natural oxide on the rear surface is completely removed.

Next, a silicon epitaxial layer is grown by vapor phase growth on the main surface of the silicon wafer W (a vapor phase growth process).

Specifically, by adjusting the heating ratio between the upper heating device 14a and the lower heating device 14b, temperature within the reaction chamber 11 is set at desired temperature (for example, 1100 degrees centigrade or higher but not exceeding 1150 degrees centigrade). The vapor phase growth gas is supplied onto the main surface of the silicon single crystal substrate W through the vapor phase growth gas inlet pipe 15, and at the same time, the hydrogen gas is supplied through the purge gas inlet pipe 16. Thus, a silicon epitaxial layer is grown by vapor phase growth on the main surface of the silicon wafer W to produce a silicon epitaxial wafer.

Figure 3:
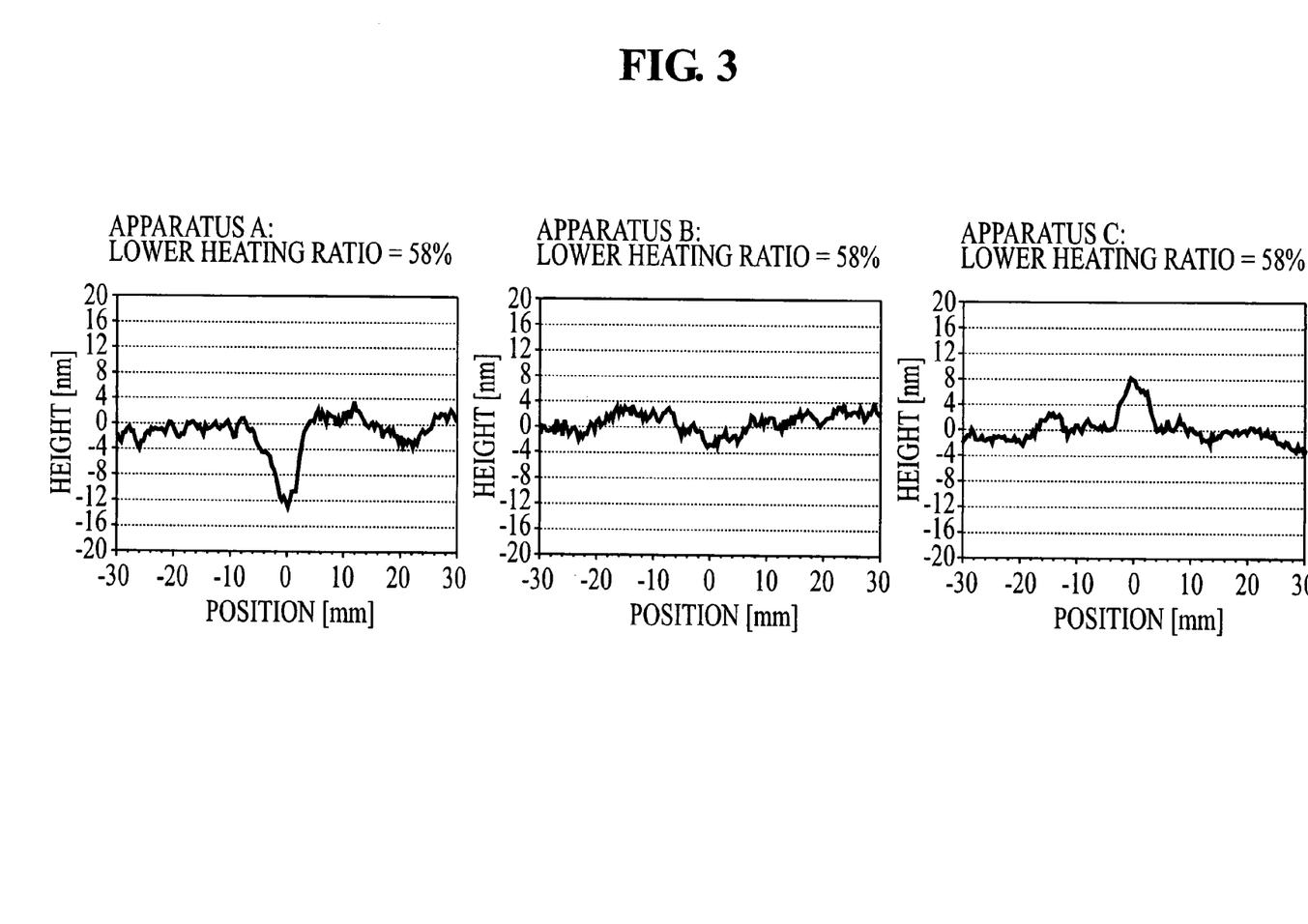
[FIG. 3] This is a view for explaining a problem of a conventional epitaxial producing method, illustrating a surface shape of a silicon epitaxial layer near lift pins.

Here, by using three epitaxial growth apparatuses (Centura 300Epi) (apparatus A, B and C) manufactured by Applied Materials, Inc., vapor phase growth was performed with a standard heating ratio (power distribution ratio) of the manufacturer (42% to 58%) between the upper heating device 14a and the lower heating device 14b. FIG. 3 shows examples of measurements of the surface shapes of the silicon epitaxial layers near the lift pins 13 of the silicon epitaxial wafers obtained by the respective apparatuses.

Note that the surface shapes are measured by using an optical wafer shape measurement device (Nanomapper manufactured by ADE Corporation). In FIG. 3, the vertical axis represents a surface shape of the silicon epitaxial layer with reference to the area around the lift pin 13, and the horizontal axis represents a distance from a position corresponding to the lift pin 13. As shown in FIG. 3, the surface shapes of the silicon epitaxial layers are different and varied depending on the apparatuses.

Figure 4:
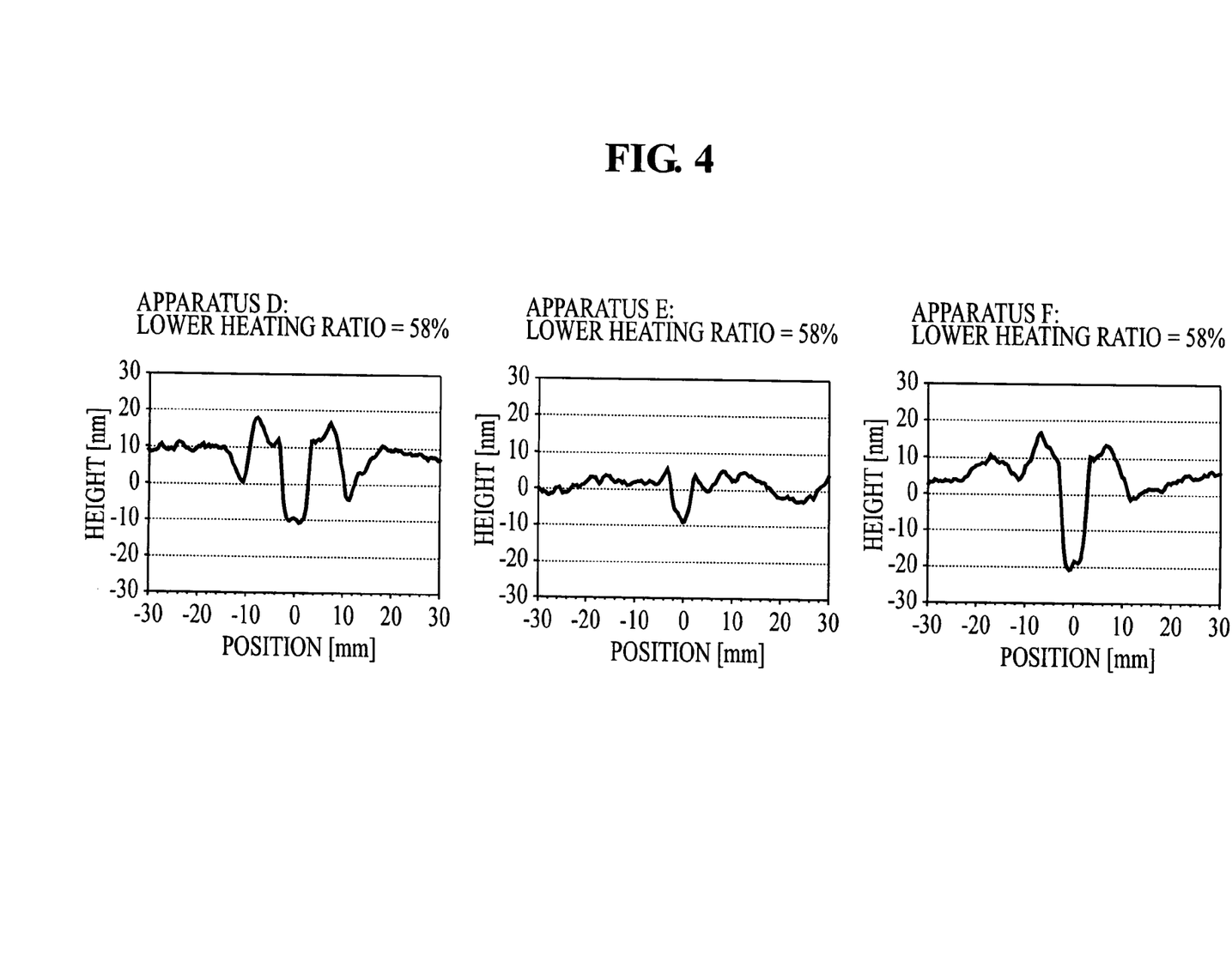
[FIG. 4] This is a view for explaining a problem of a conventional epitaxial producing method, illustrating a rear surface shape of a silicon epitaxial wafer near the lift pins.

FIG. 4 shows the results of similar measurements of the surface shapes of the rear surfaces of the silicon epitaxial wafers near the lift pins 13, obtained as described above. Similarly to the surface shapes of the silicon epitaxial layers, the shapes of the rear surfaces are different depending on the apparatuses and are varied.

Note that these positions correspond to the lift pin insertion holes formed in the susceptor. Similarly to projected portions generated at positions corresponding to the through holes also formed in the susceptor, projected portions are formed on the rear surface by the gaps (ring shape) between the lift pins and their insertion holes. However, in this case, the projected portions are formed into a ring shape outside the gap. Sometimes, the inner side of the projected portions is recessed.

Based upon the above results, an example of the present invention is described. However, the present invention is not limited to this example.

EXAMPLE

Epitaxial growth was performed by using the lift-pin type vapor phase growth apparatus A while changing the heating ratio between the upper heating device 14a and the lower heating device 14b among (44% to 56%), (46% to 54%) and (48% to 52%). Thereafter, regarding the silicon epitaxial wafers obtained with the respective heating ratios, the surface shapes of the silicon epitaxial layers near the lift pins 13 were measured and the results are shown in FIG. 5.

Figure 5:
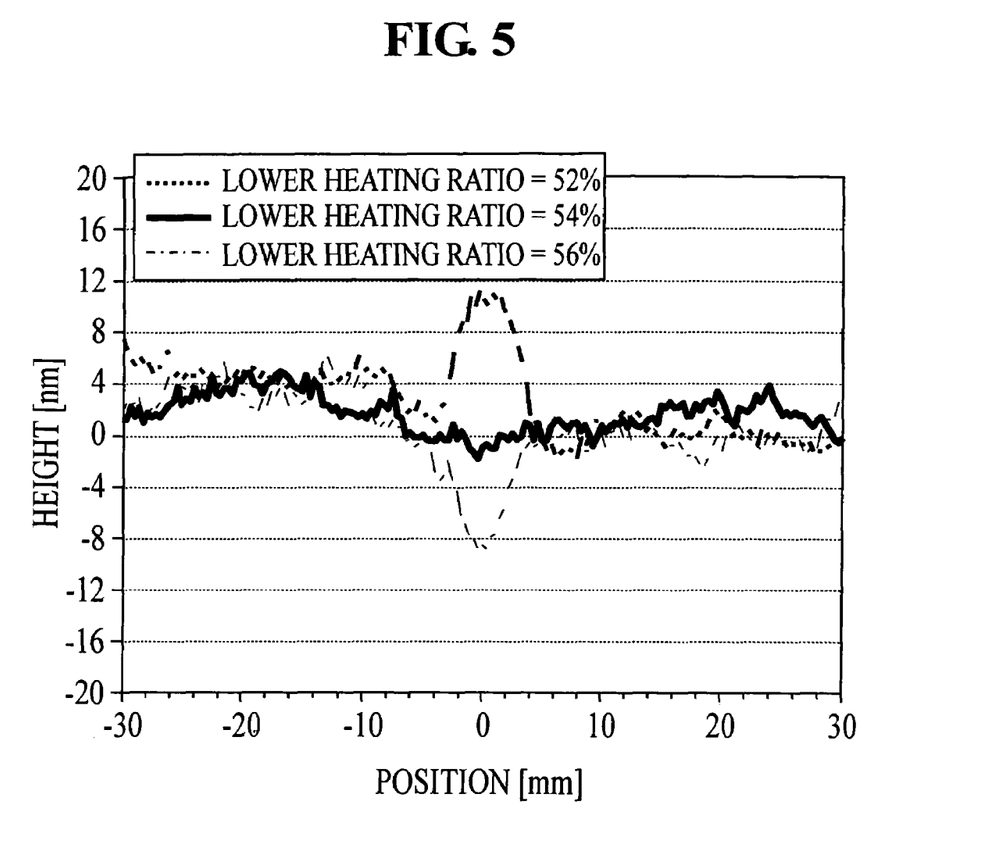
[FIG. 5] This is a view for explaining the embodiment of the present invention, illustrating a surface shape of a silicon epitaxial layer near the lift pins.

According to the results in FIG. 5, it is found that, when the output of the lower heating device 14b is relatively low to the upper heating device 14a (for example, when the output of the lower heating device is 52%), the surface shape of the silicon epitaxial layer at the positions corresponding to the lift pins 13 are projected. Specifically, when the output of the lower heating device 14b is reduced, the temperature of the susceptor 20 is decreased. Therefore, temperature of the rear surface of the silicon wafer W drops and thus temperature of the main surface thereof is also reduced. However, there is a space between the upper parts of the lift pins 13 and the susceptor 20, and heat is transferred more difficultly through the space than through the susceptor 20. Therefore, a decrease in temperature of the rear surface is suppressed. Accordingly, temperature of the main surface corresponding to the lift pins 13 increases relatively to the peripheral areas thereof, and therefore, the growth rate becomes higher. It seems to be the reason why the surface shape of the main surface of the silicon epitaxial layer near the lift pins 13 becomes projected.

On the contrary, when the output of the lower heating device 14b is relatively high (for example, when the output of the lower heating device is 56%), the surface shape of the silicon epitaxial layer at the positions corresponding to the lift pins 13 are recessed. Specifically, by increasing the output of the lower heating device 14b, temperature of the susceptor 20 increases. Therefore, temperature of the rear surface of the silicon wafer W increases and thus temperature of the main surface thereof increases as well. However, heat is transferred more difficultly in the silicon wafer W near the lift pins 13 than the susceptor 20, and an increase in temperature of the rear surface is suppressed. Thus, temperature of the main surface corresponding to the lift pins 13 becomes relatively low to the surrounding areas, and the growth rate is also reduced. This seems to be a reason why the surface shape of the main surface of the silicon epitaxial layer near the lift pins 13 is recessed.

Figure 6:
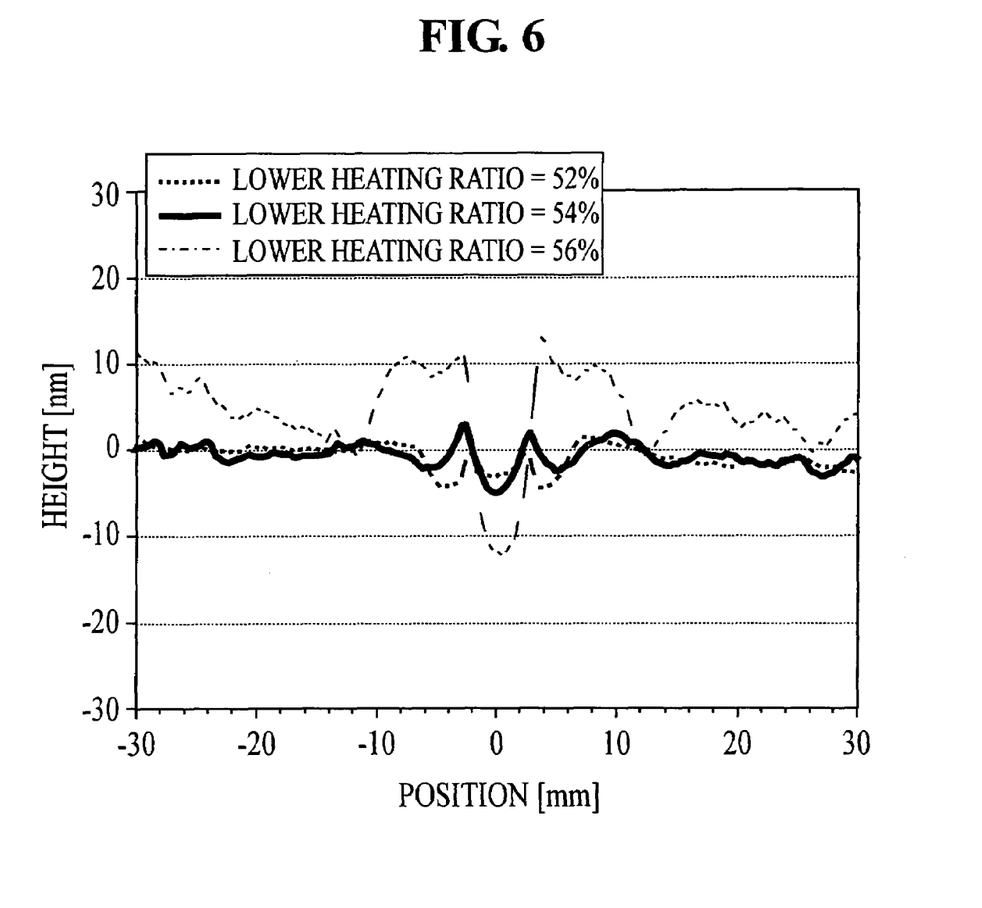
[FIG. 6] This is a view for explaining the embodiment of the present invention, illustrating a rear surface shape of a silicon epitaxial wafer near lift pins.

Meanwhile, as shown in FIG. 6, the growth rate of a silicon film on the rear surface of the silicon epitaxial wafer obtained as above becomes higher as the output of the lower heating device 14b is increased. Therefore, a projected silicon film (i.e., projected portions) is easily made at locations corresponding to the through holes (including the lift pin insertion holes). On the other hand, as the output of the lower heating device 14b is relatively increased, the growth rate of a silicon film on the rear surface of the silicon wafer W becomes lower, and it is hard to create a silicon film.

Nevertheless, when the output of the lower heating device 14b is too low, the surface shape of the silicon epitaxial layer at positions corresponding to the lift pins 13 becomes projected as stated above. Therefore, it is preferred to adjust the outputs of the heating devices 14a and 14b so that the surface shape of the silicon epitaxial layer and projected portions of the rear surface of the silicon epitaxial layer are both within the allowable range.

It is not preferred that the rear surface shape is projected because, in a process of chucking the rear surface of a wafer by a wafer chuck during a device manufacturing process, the projected shape of the rear surface is transferred to the top surface, which may cause a problem for, for example, photomicrography.

According to the foregoing results, by adjusting the heating ratio between the upper heating device 14a and the lower heating device 14b, the surface shape of a silicon epitaxial layer formed near the lift pins 13 can be controlled, and the uneven portions formed on the rear surface of the silicon wafer W can be controlled. Therefore, by adjusting the heating ratio of each apparatus as appropriate based on the above results before performing vapor phase growth on a silicon wafer W, the surface shape of the silicon epitaxial layer on the main surface can be made flat, and uneven portions formed on the rear surface of the silicon wafer at positions corresponding to the through holes (including the lift pin insertion holes) formed in the susceptor can be decreased.

INDUSTRIAL APPLICABILITY

As described above, the method for producing a silicon epitaxial wafer according to the present invention is very effective when a silicon epitaxial layer is grown by vapor phase growth on the main surface of a silicon wafer placed on the susceptor by using a vapor phase growth apparatus. In particular, it is an appropriate method for producing a silicon epitaxial wafer, in which the surface shape of the silicon epitaxial layer on the main surface can be made flatter than before and in which uneven portions are prevented from being formed on the rear surface of the silicon epitaxial wafer at positions corresponding to the positions of the through holes (including the lift pin insertion holes) formed in the susceptor.

EXPLANATION OF REFERENCE NUMERALS

W Silicon wafer
1 Vapor phase growth apparatus
11 Reaction chamber
13 Lift pin
14a Upper heating device (Upper heating member)
14b Lower heating device (Lower heating member)
20 Susceptor
25 Through holes

The invention claimed is:

1. A method for producing a silicon epitaxial wafer that uses a vapor phase deposition apparatus, the vapor phase deposition apparatus comprising:
a reaction chamber;
a susceptor within the reaction chamber on which a silicon wafer is mounted;
a lift pin vertically movable relative to the susceptor that allows the silicon wafer to be mounted on and removed from the susceptor when the lift pin is vertically moved to support the silicon wafer from a lower surface side of the silicon wafer;
an upper heating member for heating the susceptor from an upper side; and
a lower heating member for heating the susceptor from a lower side; the method comprising:
growing a silicon epitaxial layer by vapor phase growth on a main surface of the silicon wafer;
wherein:
a heating ratio of the upper heating member to the lower heating member is about 44-48% to about 52-56%; and
the heating ratio controls a surface shape of the silicon epitaxial layer formed near the lift pin on the main surface of the silicon wafer.

* * * * *